(12) United States Patent
Abali et al.

(10) Patent No.: US 9,252,805 B1
(45) Date of Patent: Feb. 2, 2016

(54) PARALLEL HUFFMAN DECODER

(71) Applicant: International Business Machines Corporation, Armonk, NY (US)

(72) Inventors: Bulent Abali, Tenafly, NJ (US); Bartholomew Blaner, Underhill Center, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/672,135

(22) Filed: Mar. 28, 2015

(51) Int. Cl.
*H03M 7/40* (2006.01)

(52) U.S. Cl.
CPC ...................... *H03M 7/40* (2013.01)

(58) Field of Classification Search
CPC ....... H03M 7/30; H03M 7/3059; H03M 7/40; H03M 7/425; H03M 7/4031; H03M 7/46; H03M 7/42; H03M 7/4081; H03M 7/6005; H03M 7/6023; H04N 19/61; H04N 19/42; H04N 19/117; H04N 19/124; H04N 19/13; H04N 19/146
USPC ................ 341/65, 67, 106, 107; 375/E7.093, 375/E7.222, 240.21, 240.25, 240.16, 375/240.11, 240.05
See application file for complete search history.

(56) References Cited

U.S. PATENT DOCUMENTS

| | | | | | |
|---|---|---|---|---|---|
| 5,428,356 | A * | 6/1995 | Ozaki | ................... | H03M 7/425 341/65 |
| 5,663,725 | A * | 9/1997 | Jang | ...................... | H03M 7/425 341/67 |
| 5,703,793 | A * | 12/1997 | Wise | .................... | G06F 12/0207 375/E7.093 |
| 5,757,295 | A * | 5/1998 | Bakhmutsky | ......... | H03M 7/425 341/100 |
| 5,798,719 | A | 8/1998 | Wise | | |
| 5,821,885 | A | 10/1998 | Wise | | |
| 5,825,314 | A * | 10/1998 | Kawauchi | ............. | H03M 7/425 341/67 |
| 5,841,380 | A * | 11/1998 | Sita | ........................ | H03M 7/425 341/67 |
| 6,311,258 | B1 * | 10/2001 | Gibson | ................. | G06F 9/3879 711/200 |
| 6,344,808 | B1 * | 2/2002 | Taruki | ..................... | H03M 7/40 341/65 |
| 6,603,413 | B2 * | 8/2003 | Igarashi | .................. | H03M 7/40 341/65 |
| 7,283,591 | B2 * | 10/2007 | Ruehle | ..................... | H04B 1/66 341/65 |
| 7,736,946 | B2 * | 6/2010 | Seppala | ................ | B81B 7/0041 257/659 |

(Continued)

OTHER PUBLICATIONS

Wei et al., "A Parallel Decoder of Programmable Huffman Codes," IEEE Transactions on Circuits and Systems for Video Technology, vol. 5, No. 2, Apr. 1995, pp. 175-178.

(Continued)

*Primary Examiner* — Linh Nguyen
(74) *Attorney, Agent, or Firm* — Jennifer R. Davis; Otterstedt, Ellenbogen & Kammer, LLP

(57) ABSTRACT

A main data input and a lookahead input are held in a holding register. Consecutive overlapping portions of the main data input and the lookahead input are provided to a plurality, M, of half-decoders, which include a subset of frequently-occurring code words of a Huffman code. When no code word not available in the half-decoders is encountered, the half-decoders decode, in parallel, in a single clock cycle, M of the frequently-occurring code words. When a code word not available in the half-decoders is encountered, input intended for a corresponding one of the half-decoders, which input includes the code word not available in the corresponding one of the half-decoders, is applied to an input of a full decoder implemented in ternary content-addressable memory. The full decoder includes all code words of the Huffman code.

20 Claims, 10 Drawing Sheets

(56) References Cited

U.S. PATENT DOCUMENTS 8,189,678 B2     5/2012   Valmiki
8,412,533 B2 *   4/2013   Choo ................ H03M 7/4006
                                                        341/200

OTHER PUBLICATIONS

Chang et al., "Direct mapping architecture for JPEG Huffman decoder," IEE Proc.-Commun., vol. 153, No. 3, Jun. 2006 p. 333-340.

Lan, "Power evaluation and design of table partition approach for JPEG Huffman decoders," Master's Thesis, Department of Electrical Engineering, Engineering, National Taiwan University of Science and Technology, 2006 (Chinese with English Abstract), pp. 1-79.

Lefurgy et al., "Evaluation of a high performance code compression method." Proceedings of the 32nd annual ACM/IEEE international symposium on Microarchitecture. IEEE Computer Society, 1999, pp. 1-10.

* cited by examiner

| text | (9,6) table | | | (10,7) table | | |
|---|---|---|---|---|---|---|
| | fraction | inp bytes/lookup | outp bytes/lookup | fraction | inp bytes/lookup | outp bytes/lookup |
| inp_alice29_txt.gz | | | | | | |
| 1st level length code lookup | 0.98 | 1.9 | 5.2 | 1.00 | 1.9 | 5.2 |
| 2nd level length code lookup | 0.02 | 89 | 248 | 0.00 | 397 | 1110 |
| 1st level distance code lookup | 0.97 | 2.8 | 7.7 | 0.99 | 2.8 | 7.7 |
| 2nd level distance code lookup | 0.03 | 95 | 265 | 0.01 | 219 | 611 |
| highly compressible | | | | | | |
| inp_ptt5.gz | | | | | | |
| 1st level length code lookup | 0.98 | 1.4 | 12.6 | 0.99 | 1.4 | 12.6 |
| 2nd level length code lookup | 0.02 | 57 | 517 | 0.01 | 124 | 1130 |
| 1st level distance code lookup | 0.95 | 3.6 | 33 | 0.99 | 3.6 | 33 |
| 2nd level distance code lookup | 0.05 | 76 | 690 | 0.01 | 292 | 2659 |
| all | | | | | | |
| inp_cantrbry_tar.gz | | | | | | |
| 1st level length code lookup | 0.95 | 1.6 | 6.2 | 0.98 | 1.6 | 6.2 |
| 2nd level length code lookup | 0.05 | 30 | 113 | 0.02 | 95 | 362 |
| 1st level distance code lookup | 0.96 | 2.8 | 11 | 0.99 | 2.8 | 11 |
| 2nd level distance code lookup | 0.04 | 60 | 229 | 0.01 | 207 | 792 |

*FIG. 9*

PARALLEL HUFFMAN DECODER

FIELD OF THE INVENTION

The present invention relates to the electrical, electronic and computer arts, and, more particularly, to system architecture and the like.

BACKGROUND OF THE INVENTION

A Huffman code is an optimal prefix code found using an algorithm developed by David A. Huffman. More common symbols are typically represented using fewer bits than less common symbols. DEFLATE is a data compression algorithm that uses a combination of the LZ77 algorithm and Huffman coding, and is specified in RFC 1951. One exemplary Huffman decoder is defined in the DEFLATE RFC 1951.

SUMMARY OF THE INVENTION

Principles of the invention provide techniques for a parallel Huffman decoder. In one aspect, a parallel Huffman data decoder, for decoding data encoded in accordance with a Huffman code, includes a holding register having a main portion holding a main data input, a lookahead portion holding a lookahead input, and a plurality of outputs; as well as a plurality, M, of half-decoders, each having an input coupled to a corresponding one of the plurality of outputs of the holding register, and an output. The inputs each obtain from the outputs of the holding register consecutive overlapping portions of data in the main portion and the lookahead portion of the holding register. Also included is a full decoder implemented in ternary content-addressable memory. The full decoder has an input selectively connectable to obtain a given one of the overlapping portions of data, and an output. A further element includes a decoder selection and sequencing unit having a plurality of inputs coupled to the outputs of the half-decoders and the output of the full decoder, a selection output that controls the selective connection of the full decoder input, and a plurality of output lanes. The full decoder includes all code words of the Huffman code; the half-decoders includes a subset of frequently-occurring code words of the Huffman code; and the half-decoders decode, in parallel, in a single clock cycle, when no code word not available in the half-decoders is encountered, M of the frequently-occurring code words. When a code word not available in the half-decoders is encountered, the decoder selection and sequencing unit causes to be applied to the input of the full decoder, input intended for a corresponding one of the half-decoders, which input includes the code word not available in the corresponding one of the half-decoders.

In another aspect, a design structure is tangibly embodied in a non-transitory machine readable medium for designing, manufacturing, or testing an integrated circuit, and the design structure includes a parallel Huffman data decoder as just described.

In still another aspect, an exemplary method for decoding, in parallel, data encoded in accordance with a Huffman code, includes holding in a holding register a main data input and a lookahead input; and providing to a plurality, M, of half-decoders, consecutive overlapping portions of the main data input and the lookahead input. The half-decoders include a subset of frequently-occurring code words of the Huffman code. When no code word not available in the half-decoders is encountered, a further step includes decoding, in parallel, in a single clock cycle, M of the frequently-occurring code words. When a code word not available in the half-decoders is encountered, a further step includes applying, to an input of a full decoder implemented in ternary content-addressable memory, input intended for a corresponding one of the half-decoders, which input includes the code word not available in the corresponding one of the half-decoders, the full decoder including all code words of the Huffman code.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Design structure aspects can be implemented using a computer program product including a computer readable storage medium with computer usable program code. Furthermore, a design structure or design process can be implemented via a system (or apparatus) including a memory, and at least one processor that is coupled to the memory and operative to implement the design structure or process.

Techniques of the present invention can provide substantial beneficial technical effects; for example, requiring less hardware resources and/or less chip area than prior techniques, via use of half decoders rather than full decoders. Note that, as used herein, "half decoders" are not necessarily exactly ½ the size of full decoders.

These and other features and advantages of the present invention will become apparent from the following detailed description of illustrative embodiments thereof, which is to be read in connection with the accompanying drawings.

BRIEF DESCRIPTION OF THE DRAWINGS

FIG. 9 shows exemplary performance data, according to an aspect of the invention.

DETAILED DESCRIPTION OF PREFERRED EMBODIMENTS

As noted a Huffman code is an optimal prefix code found using an algorithm developed by David A. Huffman. More common symbols are typically represented using fewer bits than less common symbols. DEFLATE is a data compression algorithm that uses a combination of the LZ77 algorithm and Huffman coding, and is specified in RFC 1951. One exemplary Huffman decoder is defined in the DEFLATE RFC 1951.

Furthermore in this regard, data is encoded in blocks, as follows:

<Block><Block><Block> . . . .

There may be, for example, a three-bit header in each block. The first bit may have a value of one if the given block is the last block in a sequence of blocks, or a value of zero otherwise (i.e., where more blocks are expected). The second and third bits may have the values 00 for a raw block, 01 for a fixed Huffman table (pre-agreed), and 10 for a dynamic Huffman table, stored in the block.

Compression is achieved by duplicate string elimination (LZ encoding) and use of a weighted symbol tree (Huffman encoding). Regarding duplicate string elimination, consider the following:

<Block><...S...><..S...><..P...P.>

As indicated by the arrows, repeated strings are replaced by a pointer back to the first occurrence of the string. The first copy of the string is retained. Here, subsequent occurrences of "S" are replaced by a pointer back to the first occurrence of "S" and subsequent occurrences of "P" are replaced by a pointer back to the first occurrence of "P." The pointer would include information such as "go back 100 characters and copy 10 bytes." The pointers are smaller than the original data and thus, compression can be achieved. "Zipping" a file is a non-limiting example. This is a first phase; Huffman encoding is carried out in a second phase.

The encoded strings have a length from 3-258 bytes and a distance from 1-32768 bytes (sliding window).

Figure 1:
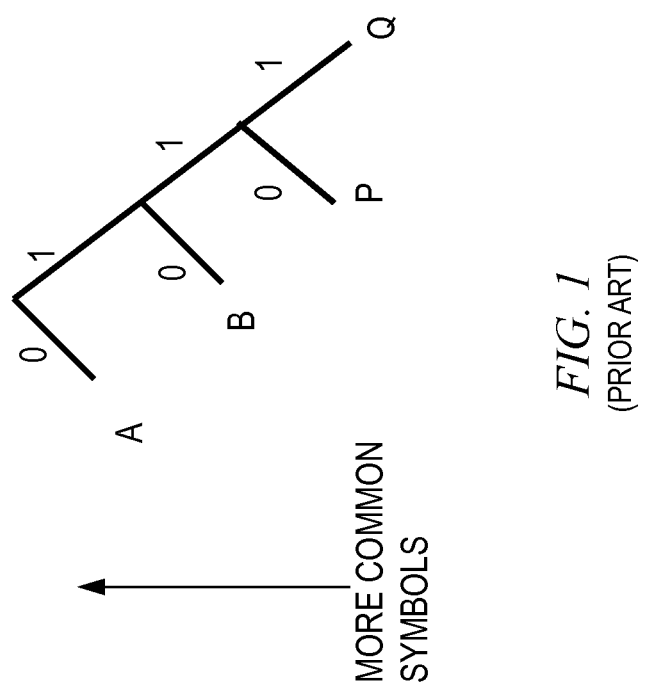
FIG. 1 shows aspects of Huffman encoding, as known from the prior art.

Referring now to FIG. 1, Huffman encoding uses fewer bits to encode more common symbols. The bit-sequence length for codes is inversely proportional to symbol frequency. The symbols A, B, P, and Q can be encoded, for example, as follows:

Symbol:code=A:0, B:10, P:110, Q:111.

Huffman encoding is prefix-free; i.e., no code's bit sequence is a prefix for another. Thus, B:10→C:101 is not possible.

Furthermore regarding the prefix-free property, when encoded bits are concatenated there is no ambiguity about when one symbol starts and stops. Therefore, no markers separating symbols are needed. The sequence PABQ can thus be encoded as 110010111. However, this complicates construction of parallel decoder because it is a bit serial process.

Furthermore regarding DEFLATE, the Huffman encoder encodes symbols into codes. Two hundred eighty-eight symbols encode literals and pointer lengths, as follows:

0-255: Literals (e.g. raw ASCII will be here)
256: end of a deflate block (terminal symbol)
257-285: match length of 3-258 bytes+extra bits (not a literal but a string (match) length for the pointer that will follow this codeword).

The following table shows string match lengths:

| SYMBOL | EXTRA BITS | MATCH LENGTH |
|---|---|---|
| 256 | 0 | 3 |
| 257 | 0 | 4 |
| ... | | |
| 265 | 1 | 11-12 |
| ... | | |
| 269 | 2 | 19-22 |
| ... | | |
| 284 | 5 | 227-257 |
| 285 | 0 | 258 (for run length encoding) |
| 286-287 | reserved | |

Note that the symbols are first "Huffmanized" and then extra bits are appended to encode the match len (length).

Regarding distance, for pointer encoding, <Match Length> is always followed by <Distance>. There are 32 distance encodings, as follows:

| Symbols | Distances (bytes) |
|---|---|
| 0-3 | 1-4 |
| 4-5 | 5-8 + 1 extra bit |
| 6-7 | 9-16 + 2 extra bits |
| ... | |
| 28-29 | 16385-32768 + 13 extra bits |
| 30-31 | reserved |

Figure 2:
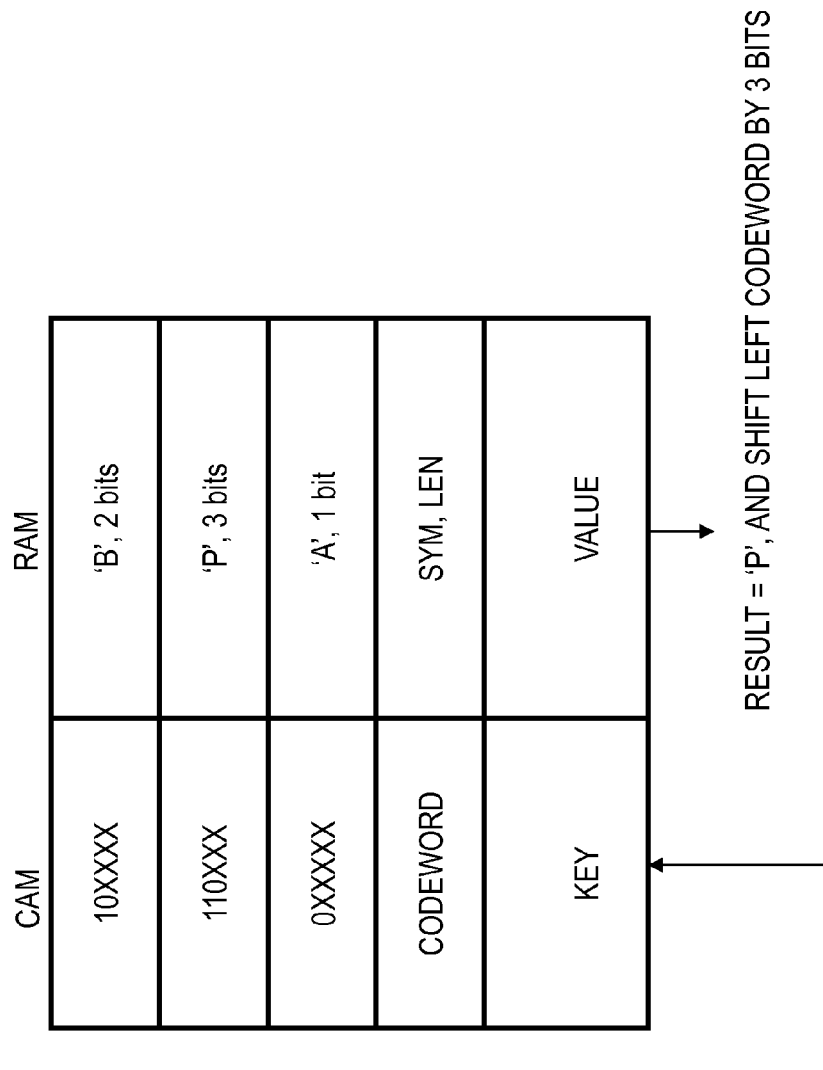
FIG. 2 shows an exemplary ternary content-addressable memory (TCAM)-based decoder, according to an aspect of the invention.

FIG. 2 shows an exemplary TCAM-based decoder. Any kind of TCAM can be used to implement one or more embodiments. The input is the bit sequence 110010111 whose first three symbols are PAB. This is used as a key to query the content-addressable memory (CAM). The CAM entries have "ternary digits" with zero, one, or "don't care" (X) values. The first "hit" in the CAM is for 110XXX which corresponds to the symbol P, having a three-bit length. The input is then shifted left three bits, and the next "hit" is for 0XXXXX which corresponds to the symbol A, having a one-bit length. The input is then shifted left one bit, and the next "hit" is for 10XXXX which corresponds to the symbol B, having a two-bit length.

Consider now CAM array widths. Note that a "bit" has value of zero or one while a (ternary) "digit" in this context can have values of zero, one, or don't care (X). The DEFLATE max bit sequence length is 15 bits. It may be desirable to prefix each CAM word with either digit 0 (signifying that this is a "MatchLen" (match length) code) or 1 (signifying that this is a Distance code)—that is, if both the Literal/Len and Distance tables are stored in the same TCAM. Therefore, the TCAM part should be at least 16 digits wide excluding any error correcting code (ECC).

Consider now CAM and RAM array lengths. With 288 literal/length symbols and 32 distance symbols, 288+32=320 entries, implying 512 TCAM entries (rounding up to the next power of two). Note that rounding up is optional; most technologies are sized in powers of two, however, this is not required and the skilled artisan will appreciate that of fractional sizing is available, rounding up is not necessarily needed.

Now, with regard to the RAM array width, in one or more non-limiting embodiments, if symbols and code bit-lengths are stored in the RAM, assume 9 bits for 288 literal/len symbols ("len" is used herein as a shorthand for "length"), assume 5 bits for distance symbols, and the RAM word will contain either literal/len or distance→max(9,5)=9 bits. With a one-bit prefix to distinguish literal/len from distance symbols, therefore, 10 bits will be sufficient for identifying literal/len and distance symbols. The input shift values can be stored in the RAM as well. In this regard, the max bit-length of the CAM word (Huffman code)=15, while 13 extra bits are used for distance codes; thus, 15+13=28 bits. This means that input may be shifted by 28 positions or less→$\log_2(28)$=5 bits (rounding up to nearest integer) to store in the RAM entry. The total is thus 10+5=15 bits for RAM excluding ECC. In some instances, additional RAM bits may be needed; for example, for controlling decoder state machines and the like.

If symbols and code bit-lengths are stored in a separate SRAM, then only the address of the separate SRAM needs to be stored, implying that $\log_2(512)$=9 bits is the RAM portion of the TCAM excluding ECC.

Consider now the problem of decoding a bit sequence such as the following:

11001010101100110010010010101001111

Due to the variable length coding (VLC), data boundaries are not easily identified. A simple serial decoder decodes 1 bit at a time from left to right which is too slow. One or more embodiments advantageously decode, for example, up to 128 bit strings in a single cycle.

Figure 3:
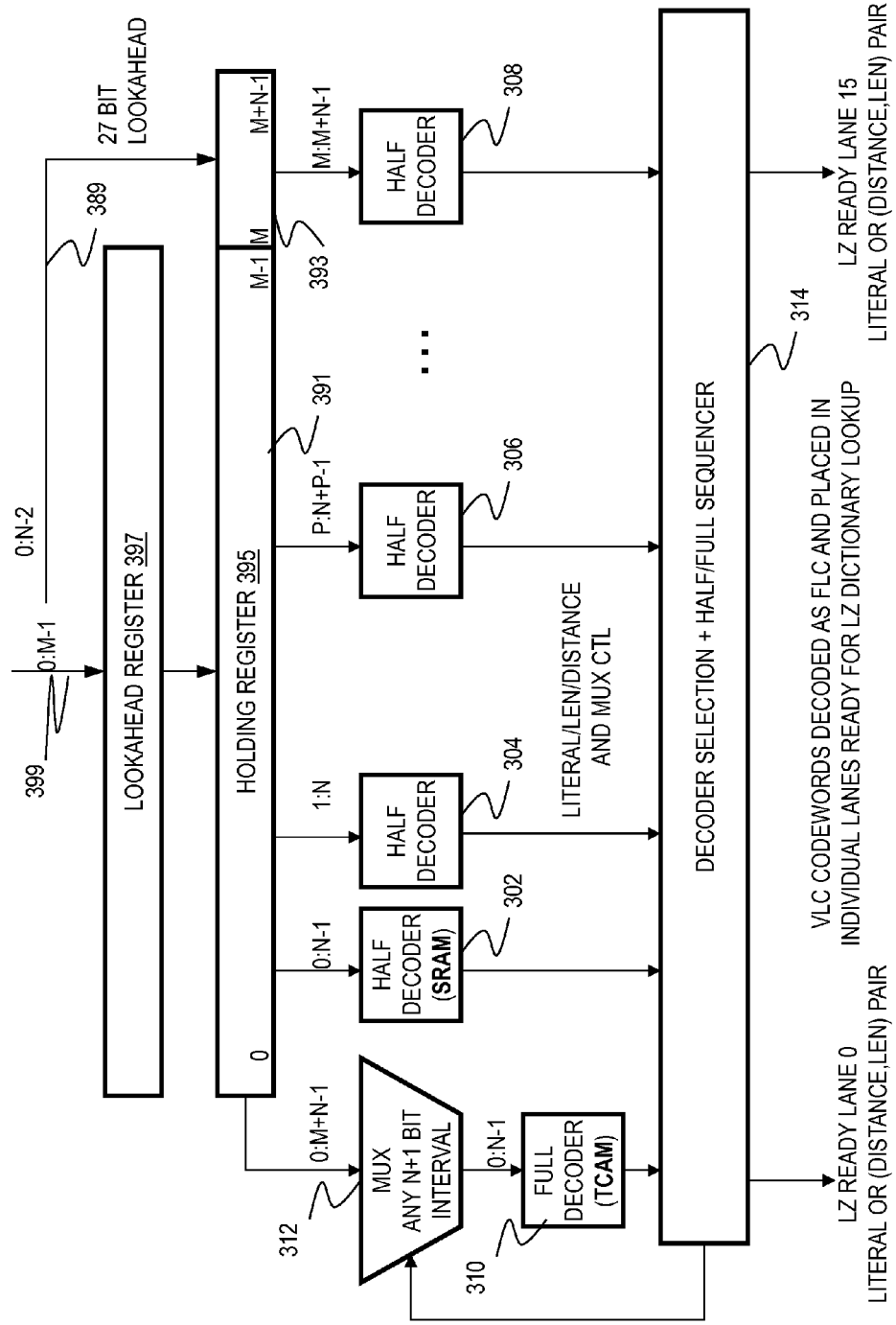
FIG. 3 shows an embodiment of a parallel Huffman decoder, according to an aspect of the invention.

Reference should now be had to FIG. 3. Data 399 is a stream of bits contained Huffman-encoded symbols, which are of variable length (say, 1-15 bits, or perhaps 28 bits when certain extra bits are included). Because the codes are variable length, it is not known a priori where the boundaries are. It is not known where one symbol stops and another one starts; determining these boundaries is part of the decoding process. Since the symbols are variable length, and since the symbols are coming in one clock cycle after another, a symbol may span a clock boundary. A symbol may start in one "word" and end in another "word" where the words are merely samples of data taken each clock cycle. In a non-limiting example, if 128-bit wide samples of data 399 are taken (i.e. M=128), and supposing (purely for illustrative purposes as the symbols are actual of variable length) each encoded symbol is ten bits wide, an integer number of 10-bit symbols will not fit in the 128-bit slice of data; there will be 12 ten-bit symbols and eight bits of the next symbol; the remaining two bits of that symbol will arrive in the next clock cycle's input. This is dealt with in one or more embodiments via lookahead tap 389. In particular, suppose the maximum code size N is 28 bits. In the worst case, a symbol may start at the last bit of the M (e.g. 128) bits and continue for N−1 (e.g. 27) bits into the next clock cycle. Therefore, an N−1=27 bit lookahead tap is employed. The input data 399 is thus sampled in M (e.g. 128) bit wide chunks with the bits numbered zero through M−1 (e.g. 0 through 127) and N−1 lookahead bits numbered zero through N−2 (e.g., 0 through 26) are tapped.

An M (e.g. 128) bit wide sample of data 399 is fed to the lookahead register 397, which holds same for one clock cycle so that when it arrives at the holding register 395, it will be at the same time as the lookahead data from tap 389, which was not delayed in lookahead register 397. The data in the holding register 395, including the M (e.g. 128) bit wide sample of data 399, numbered 391, and the data from lookahead tap 389, numbered 393, is fed to the half-decoders 302, 304, 306, . . . 308. In holding register 395, the bits in the M (e.g. 128) bit wide sample of data 399, numbered 391, are numbered zero to M−1 (e.g., 0 to 127), while the bits in the data from lookahead tap 389, numbered 393, are numbered M through M+N−1 (e.g., 128 to 155).

The half-decoders 302, 304, 306, . . . 308 contain the most common code words (content replicated across all decoders). The full-decoder 310 contains all the code words. The first half decoder 302 is wired to bits 0 through N−1 (e.g. 27) of holding register 395, the next half decoder 304 is wired to bits 1 through N (e.g. 28) of holding register 395, and so on. In the common case, all half-decoders simultaneously decode their input slice. Each slice is N (e.g. 28) bits long, overlapping the one on the left by 1 bit. In a non-limiting example, there are 128 half decoders. The decoding is speculative because the code boundaries are not known a priori.

SRAMs are cheaper, smaller, and use less power than TCAMs, thus making the use of SRAM-based half decoders advantageous. Given the teachings herein, the skilled artisan will be able to implement half decoders in, for example, SRAM or dynamic random access memory (DRAM), as well as full decoders in TCAM.

Reference should now be had to FIG. 9. The half decoders will store the first level data (commonly found codes). The more rarely found codes will be included only in the second level data which will be stored in the Full Decoder according to embodiments of the invention. The tables of FIG. 9 show how often a code will not be found in the first level. For example, for the inp_alice29_txt.gz benchmark, 98% of the time, for the (9,6) table case, codes will be found in the first level length code lookup, while only 2% of the time is resort to the second level lookup necessary. FIG. 9 shows two different examples for three different benchmarks. In the (9,6) table example, the first level table is SRAM with $2^9$ entries of literal/length and $2^6$ entries of distance, while in the (10,7) table example, the first level table is SRAM with $2^{10}$ entries of literal/length and $2^7$ entries of distance. In the (10,7) table example, the value of 397 in the second column, second row means that on average, every 397 bytes of input, the decoder needs to consult the second level literal/length table. Note that "inp_alice29_txt.gz" is a benchmark commonly used when compressing text, and the other .gz files indicated are also known benchmarks.

Figure 4:
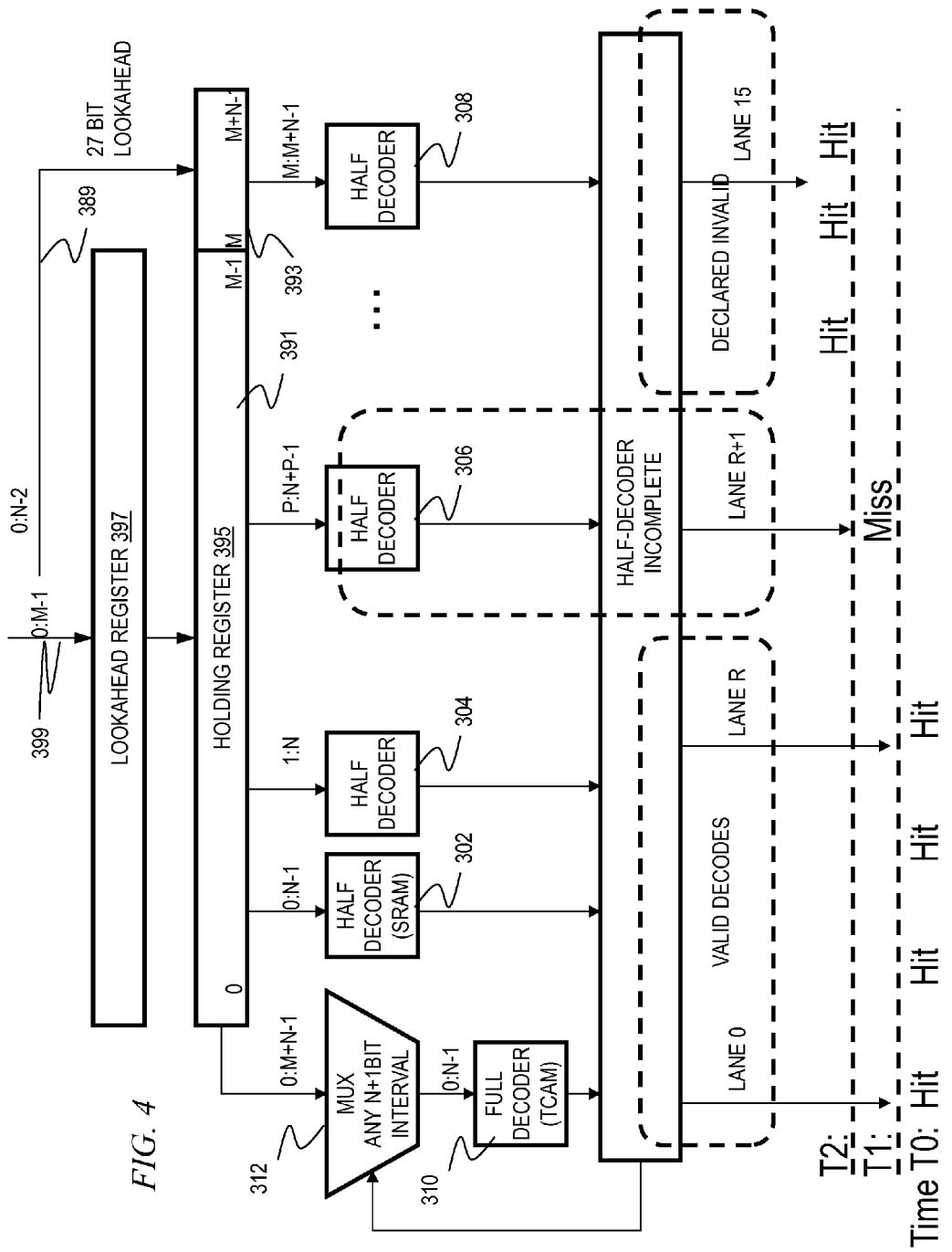
FIG. 4 shows further aspects of a parallel Huffman decoder, according to an aspect of the invention.

As seen in FIG. 4, if a half-decoder such as 306 cannot complete its work (mis-decode because, in the example just discussed regarding FIG. 9, it is one of the 2% of codes not found in the first level), its input slice is multiplexed to the full decoder (see "Miss" at time T1). The remaining half-decoder outputs to the right (here, 308) are declared invalid because their starting bit position is dependent on the incomplete decoder output. The full-decoder decodes the mis-decoded input slice in the next cycle.

Note that only a single input is shown to multiplexer 312 but in fact the entire output width of the holding register, including the lookahead bits, is available to multiplexer 312 and the appropriate bits (corresponding to the half decoder that has missed) are selected based on a selection signal from selection unit 314, and are routed to full decoder 310. At the bottom of FIG. 4, at time T0, the indicated half decoders are successful ("Hit"); i.e., the codes were found and the output is valid. At time T1, half decoder 306, for which the code was not found, indicates a "Miss" which requires sending its input to full decoder 310. The decoders to the right (e.g., 308) cannot proceed because the code boundaries are not known due to the failure of half decoder 306. The full decoder 310 provides the answer, and then, in time T2, the remaining half decoders to the right can continue.

Once the full decoder completes, the remaining half-decoders follow suit (in the same cycle as the full-decoder or the following cycle).

The decoder selection unit 314 identifies, from left to right, the valid decodes out of many, eliminating "bogus" decodes crossing data boundaries.

FIG. 3 thus depicts an exemplary a parallel Huffman data decoder including multiple (128 in a non-limiting example) half-decoders 302, 304, 306, 308 (only a few are shown to avoid clutter) constructed using static random access memory (SRAM), and one full-decoder 310 constructed using a Ternary CAM (TCAM). The parallel decoder of FIG. 3 speculatively decodes up to 128 code words in parallel in one clock cycle (as compared to only a few bits per cycle in current systems). The half-decoders 302, 304, 306, 308 are constructed with SRAM, typically with 9-10 address inputs using only 512 to 1024 frequent code words. The full codeword decoder 310 is constructed using a Ternary CAM (TCAM) containing all the code words including infrequent as well as frequent ones. Note that the total number of entries in a full Huffman decoder table (in the 1st and 2nd levels) will be as follows (based on the zlib source code found at zlib dot net, "." rendered as "dot" to avoid inclusion of browser-executable code.

The (9,6) case: 852 for length/literal+592 for distance=1444 total; compare that to a half decoder that needs 29+26=576 total;

The (10,7) case: 1332 for length literal+400 for distance=1732 total; compare that to a half decoder that needs 210+27=1152 total.

The half-decoders 302, 304, 306, 308 each have 28 bit inputs sampling the 128 bit data in one bit overlapping intervals, therefore making speculation possible.

The full-decoder 310 has a 28 bit input multiplexed via multiplexer 312 from one of M intervals of 28 bits from the M bit data, while the M-bit data is extended by 27 bits with the data from the next data cycle to be able to decode 28 bit data crossing an M-bit boundary. A half-decoder effectively forwards its input to the full-decoder through the multiplexer 312 when it cannot decode the codeword; a decoder selection unit 314 chooses the valid decoded code words from among many decodes. (As discussed above, the entire output width of the holding register, including the lookahead bits, is available to multiplexer 312 and the appropriate bits (corresponding to the half decoder that has missed) are selected based on a selection signal from selection unit 314, and are routed to full decoder 310.

Note that the exemplary values of 128, 28, and 27 can, in the general case, be replaced with arbitrary values of M (width of chunk of input data), N (size of input to each half decoder), and K (N−1, number of lookahead bits) respectively. Thus, M bits numbered zero through M−1 of an input data stream 399 are fed to lookahead register 397 and then to holding register 395. In the non-limiting example of FIGS. 3 and 4, M=128. Meanwhile, N−1 bits zero though N−2 (N=28 in the non-limiting example of FIGS. 3 and 4) are tapped from the input stream 399 to a lookahead portion 393 of holding register 395. The main portion 391 of holding register 395 thus includes bits zero through M−1 of the input data stream 399 while the lookahead tap has bypassed the lookahead register 397 and thus lookahead portion 393 of holding register 395 includes the N−1 bits zero though N−2 (N=28 in the non-limiting example of FIGS. 3 and 4) that are from the next cycle since the lookahead register 397 was bypassed by the tap. These are bits M through M+N−1, i.e., 129 through 155 in the non-limiting example. Again, for the avoidance of confusion, note that the half-decoder slices are 28 bits wide but there are only 27 lookahead bits plus one overlap bit.

In some embodiments, the half-decoders each have 28 bit inputs sampling the 128 bit data in 1 bit overlapping intervals, therefore making speculation possible; and the full-decoder has a 28 bit input multiplexed from one of M intervals of 28 bits from the M bit data, while the M-bit data is extended by 27 bits with the data from the next data cycle to be able to decode 28 bit data crossing an M-bit boundary. The half-decoder forwards its input to the full-decoder through the multiplexer when it cannot decode the code word. Thus, in the non-limiting example of FIG. 3, half decoder 302 has input bits zero through N−1 (27), half decoder 304 has input bits one through N (28), half decoder 306 has input bits P through N+P−1, and so on.

The variable length code words are decoded by the full decoder 310 (as needed), and by the half decoders 302, 304, 306, 308, as fixed length codes and placed in individual lanes (here, sixteen lanes zero through 15) ready for LZ dictionary lookup.

Figure 5:
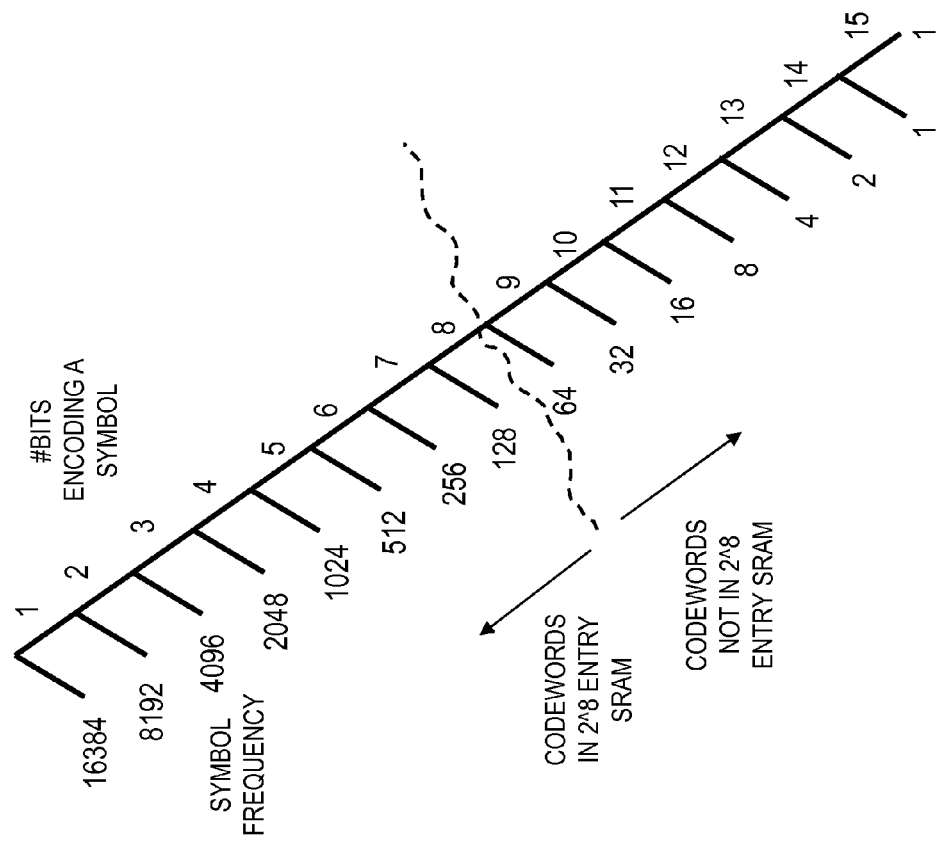
FIGS. 5 and 6 show symbol distribution, according to aspects of the invention.

FIG. 5 shows an exemplary coding tree. There are 16384+8192+ . . . +1+1=32768 total occurrences; 64+32+ . . . +1+1=128 longer than 8 bit codeword occurrences; and 32+16+ . . . +1+1=64 longer than 9 bit codeword occurrences. The probability of 16 half-decoders completing in the same cycle for a 2^8 SRAM=94% while the probability of 16 half-decoders completing in the same cycle for a 2^9 SRAM=97%. Note that many symbol distributions may result in a more balanced tree, and a larger fraction of code words may fall out of the half-decoder's SRAM. Therefore, a 2^10 entry or larger table may be desirable. Since this is all data dependent, given the teachings herein, benchmark files can be used by the skilled artisan to choose the table size. The codes below the dashed line occur infrequently compared to the codes above the dashed line; the codes above the dashed line are found in the half decoders while those below the dashed line are found only in the full decoder.

Figure 6:
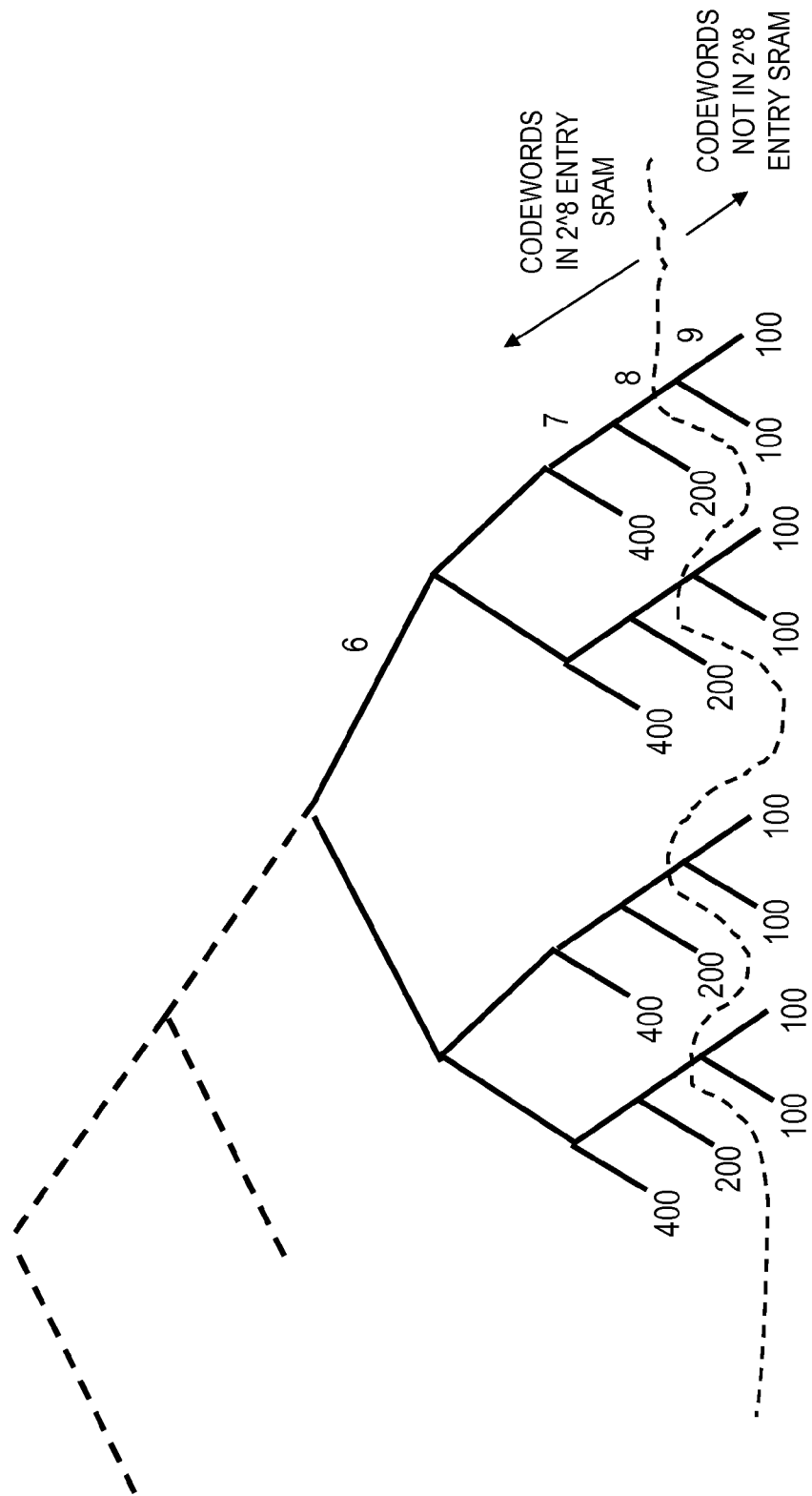

FIG. 6 shows a more balanced tree example. The data has 256 symbols in it; 25% of the symbols occur 400 times each; 25% occur 200; and 50% occur 100 times each. Eight symbols implies four deep while 256 symbols implies nine deep. Therefore a maximum of nine bits will encode the entire set of 256 symbols. If an eight-bit table is employed, that will leave (100+100)/800=25% of the symbols outside the table. Again, the codes below the dashed line occur infrequently compared to the codes above the dashed line; the codes above the dashed line are found in the half decoders while those below the dashed line are found only in the full decoder. Here, an eight-bit table may result in too many misses so that a nine-bit table is preferable.

Consider now the full decoder 310 of FIGS. 3 and 4, shown in more detail in FIG. 2. It contains the entire Huffman table, with up to 288 Literal/Length symbols and up to 32 Distance symbols. Each entry indicates the decoded symbol (9 bits); the number of code word bits (1-15) (4 bits); and the appropriate control characters (e.g. invalid code word). There can be up to 13 extra bits which are arguments of the code; 15+13=28. With, as noted, up to 288 Literal/Length symbols and up to 32 Distance symbols, 288+32 is less than 512 (next highest power of 2), implying that 512 TCAM entries should be sufficient. The input is the bit sequence 110010111 corresponding to the symbols PABQ. This is used as a key to query the content-addressable memory (CAM). The CAM entries (code words) may have zero, one, or "don't care" (X) values for each "ternary digit." The corresponding RAM entries include the symbol and its length. The first "hit" in the CAM is for 110XXX which corresponds to the symbol P, having a three-bit length. The input is then shifted left three bits, and the next "hit" is for 0XXXXX which corresponds to the symbol A, having a one-bit length. The input is then shifted left one bit, and the next "hit" is for 10XXXX which corresponds to the symbol B, having a two-bit length.

Consider now the half-decoders 302, 304, 306, 308. Each half decoder contains a portion of the Huffman table and is SRAM-based. Each half decoder stores frequent Length/Literal symbols and stores frequent Distance symbols. In one or more non-limiting embodiments, the code words that are decoded are 8-10 bits wide which results in a 2^8 to 2^10 entry SRAM. Each entry indicates:

The symbol (9 bits)
Number of codeword bits (0-10) (4 bits)
Control characters (e.g. invalid codeword).

Wide SRAMs are desirable because the per-bit area is smallest and the Huffman table can be loaded fast. Ten-bit code words will result in less than 2^10 writes for the same reason Huffman encoding works well, e.g., SRAM entries for each row can be written in one cycle, if the "Don't Care" bits select within the row. For example, for the input code word 100000xxx, the SRAM location 100000, Entries 0-7 all contain the same Symbol, SymLen . . . . In the best case, 128 writes to the 128 x144 SRAM will load the table.

Figure 7:
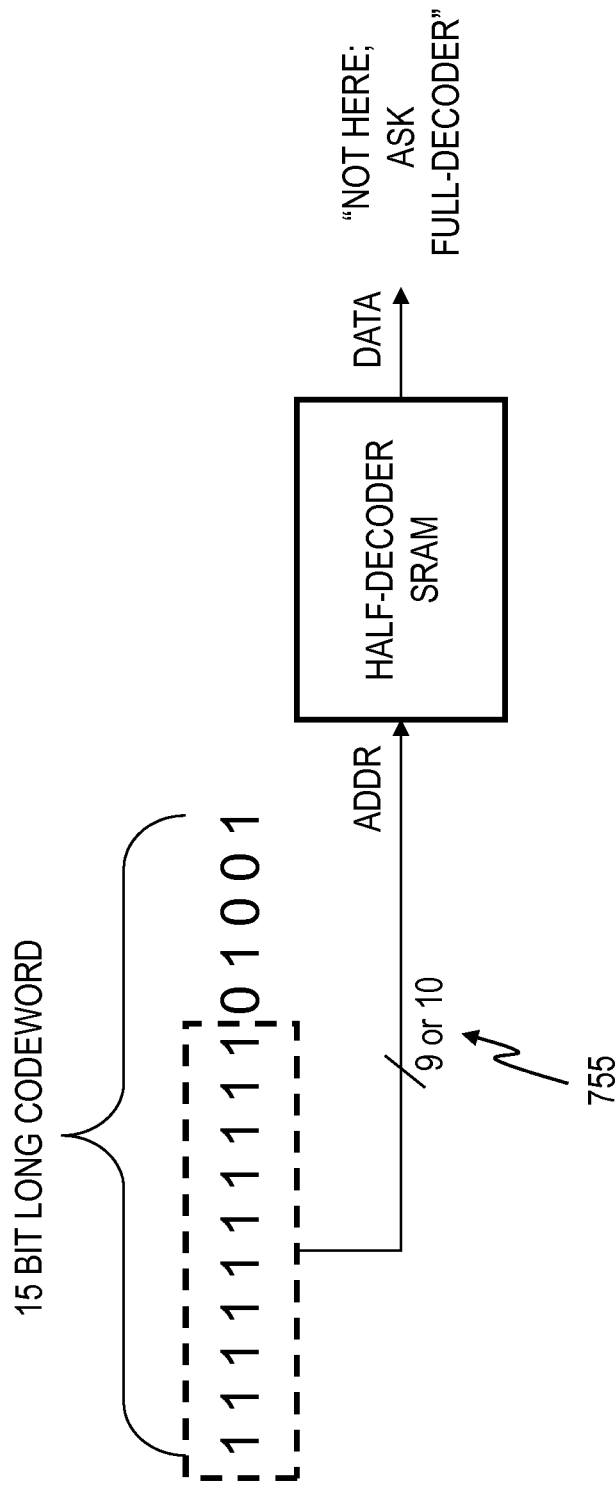
FIG. 7 shows a technique for dealing with code words not handled by the half-decoder, according to an aspect of the invention.

Referring to FIG. 7, for code words not handled by the half-decoder, the SRAM entry that the long code word indexes will have a control bit that tells the system to look elsewhere (that half decoder's bits routed to full decoder via multiplexer controlled by block 314 as discussed above). The half decoder may have, for example, $2^9$ or $2^{10}$ entries. Referring to 755, the half decoder will thus look at only the first 9 or 10 bits of the input. Because the most frequent symbols use the smallest number of bits, and because the half decoder includes only more frequently occurring symbols, the half decoder will be able to find the code words it is capable of deciphering by looking at only the first 9 or 10 bits. When the first 9 or 10 bits are not defined, the bits are routed to the full decoder as discussed above.

Figure 8:
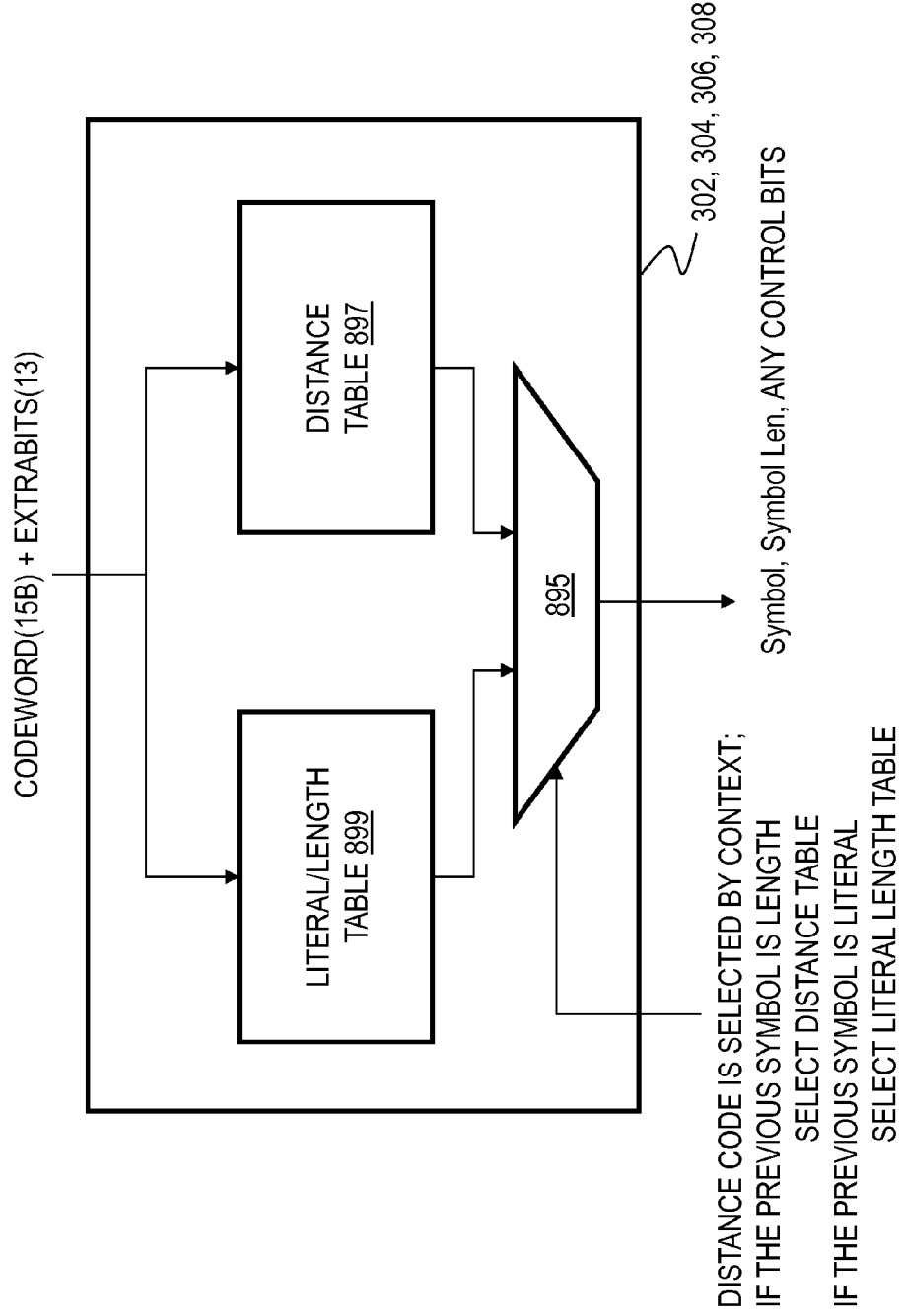
FIG. 8 shows a further half-decoder aspect of the invention.

Furthermore regarding the half-decoders, attention should now be given to FIG. 8. As seen therein, literals and distances can be stored in separate tables 899, 897. From outside, it appears as only a single table. Logic (the selection signal to the multiplexer 895) chooses one table or the other. The distance code is selected by context: if the previous symbol is length, the logic tells the multiplexer to select distance table 897; if the previous symbol is literal, the logic tells the multiplexer to select literal length table 899. The multiplexer output includes, as the case may be, Symbol, Symbol Len, and any control bits.

Various optimizations are possible. For example, the number of half decoders may be reduced based on the expected compression ratio. If a 2:1 compression ratio is expected, the input is ingested at ½ the rate of output, thus ½ as many half-decoders may be necessary; for example, an input width of 8 bytes and an output width of 16 bytes. For uncompressible data, the output rate will drop to the input rate.

FIG. 9 shows non-limiting exemplary performance data, discussed above.

One or more embodiments advantageously decode multiple codes per cycle using TCAM and SRAM. This should be distinguished from prior techniques where N results are obtained in a parallel but only one result can be a valid code, such that in such prior-art systems, only one Huffman symbol per cycle is actually decoded.

The DEFLATE standard (more generally, dynamic tree-based Huffman codes) need to be table-based; hence, one or more embodiments employ SRAM or TCAM or both.

Note that one or more embodiments decode a single stream in parallel as opposed to decoding multiple independent streams decoded 1 symbol per cycle per stream.

One or more embodiments thus provide a parallel Huffman data decoder including at least one half-decoder constructed using SRAM, and at least one full-decoder constructed using a Ternary CAM (TCAM), as well as a decoder selection unit that chooses, from among many decodes, the valid decoded code words. The exemplary Huffman decoder values of 128, 28, 27 can, as noted, be replaced with arbitrary values of M, N, and K respectively. In one or more embodiments, the parallel decoder speculatively decodes up to 128 code words in parallel in one clock cycle; the half-decoders are constructed with SRAM, typically with 9-10 address inputs using only 512 to 1024 frequent code words; and full codeword decoders are constructed using a Ternary CAM (TCAM) containing all the code words including the infrequent ones as well.

In some embodiments, the half-decoders each have 28 bit inputs sampling the 128 bit data in 1 bit overlapping intervals, therefore making speculation possible; and the full-decoder has a 28 bit input multiplexed from one of M intervals of 28 bits from the M bit data, while the M-bit data is extended by 27 bits with the data from the next data cycle to be able to decode 28 bit data crossing an M-bit boundary. The half-decoder forwards its input to the full-decoder through the multiplexer when it cannot decode the code word.

The elements in the figures are generally implemented in hardware. In one or more embodiments, the lookahead register 397 and holding register 395 are hardware registers that can be implemented with known techniques; the full decoder is implemented in TCAM; the half decoders are implemented in SRAM (or alternatively, DRAM); the multiplexer 312 is implemented using known multiplexing circuitry; and the selection unit 314 is implemented in hardware state machines and random logic.

Given the discussion thus far, it will be appreciated that, in general terms, an exemplary parallel Huffman data decoder for decoding data encoded in accordance with a Huffman code, in accordance with an aspect of the invention, includes a holding register 395 having a main portion 391 holding a main data input, a lookahead portion 393 holding a lookahead input, and a plurality of outputs. Also included are a plurality, M, of half-decoders 302, 304, 306, 308, each having an input coupled to a corresponding one of the plurality of outputs of the holding register, and an output. The inputs each obtain, from the outputs of the holding register, consecutive overlapping portions of data in the main portion and the lookahead portion of the holding register. Another element is a full decoder 310 implemented in ternary content-addressable memory. The full decoder has an input selectively connectable to obtain a given one of the overlapping portions of data, and an output. A decoder selection and sequencing unit 314 has a plurality of inputs coupled to the outputs of the half-decoders and the output of the full decoder, a selection output that controls the selective connection of the full decoder input, and a plurality of output lanes. The full decoder includes all code words of the Huffman code, while the half-decoders includes a subset of frequently-occurring code words of the Huffman code. When no code word not available in the half-decoders is encountered, the half-decoders decode, in parallel, in a single clock cycle, M of the frequently-occurring code words. When a code word not available in the half-decoders is encountered (see FIG. 4), the decoder selection and sequencing unit 314 causes to be applied to the input of the full decoder 310, input intended for a corresponding one of the half-decoders (e.g., 306), which input includes the code word not available in the corresponding one of the half-decoders.

In one or more embodiments, the half-decoders are implemented in a less expensive technology than the ternary content-addressable memory, such as SRAM or DRAM.

Some embodiments further include a lookahead register 397 having a data input to obtain a data stream 399, and having an output coupled to the main portion 391 of the holding register 395. The holding register obtains the lookahead input by tapping the data stream and bypassing the lookahead register, as seen at 389.

Some embodiments further include a multiplexer 312 having a first input coupled to the holding register 395, a selection input, and an output coupled to the input of the full decoder 310. The decoder selection and sequencing unit 314 causes to be applied to the input of the full decoder 310, the input intended for the corresponding one of the half-decoders (e.g., 306), which input includes the code word not available in the corresponding one of the half-decoders, by sending a selection signal to the selection input of the multiplexer 312.

In one or more embodiments, the overlapping portions of data overlap by one bit.

Furthermore, given the discussion thus far, it will be appreciated that an exemplary method for decoding, in parallel, data encoded in accordance with a Huffman code, according to another aspect of the invention, includes holding in a holding register 395 a main data input 391 and a lookahead input 393; and providing to a plurality, M, of half-decoders 302, 304, 306, 308, consecutive overlapping portions of the main data input and the lookahead input. The half-decoders include a subset of frequently-occurring code words of the Huffman code. When no code word not available in the half-decoders is encountered, a further step includes decoding, in parallel, in a single clock cycle, M of the frequently-occurring code words. On the other hand, when a code word not available in the half-decoders is encountered, a further step includes applying to an input of a full decoder 310 implemented in ternary content-addressable memory, input intended for a corresponding one of the half-decoders (e.g. 306), which input includes the code word not available in the corresponding one of the half-decoders. The full decoder includes all code words of the Huffman code.

A further step in some cases includes implementing the half-decoders in a less expensive technology than the ternary content-addressable memory, such as SRAM or DRAM.

In some embodiments, a further step includes holding the main data input in a lookahead register 397 while the lookahead input (see 389) bypasses the lookahead register.

In some embodiments, the applying, to the input of the full decoder, the input intended for the corresponding one of the half-decoders, is implemented with a multiplexer 312.

Exemplary Integrated Circuit and Design Structure Details

One or more exemplary methods as described herein can be used in the fabrication, testing, or operation of integrated circuit chips. The integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Figure 10:
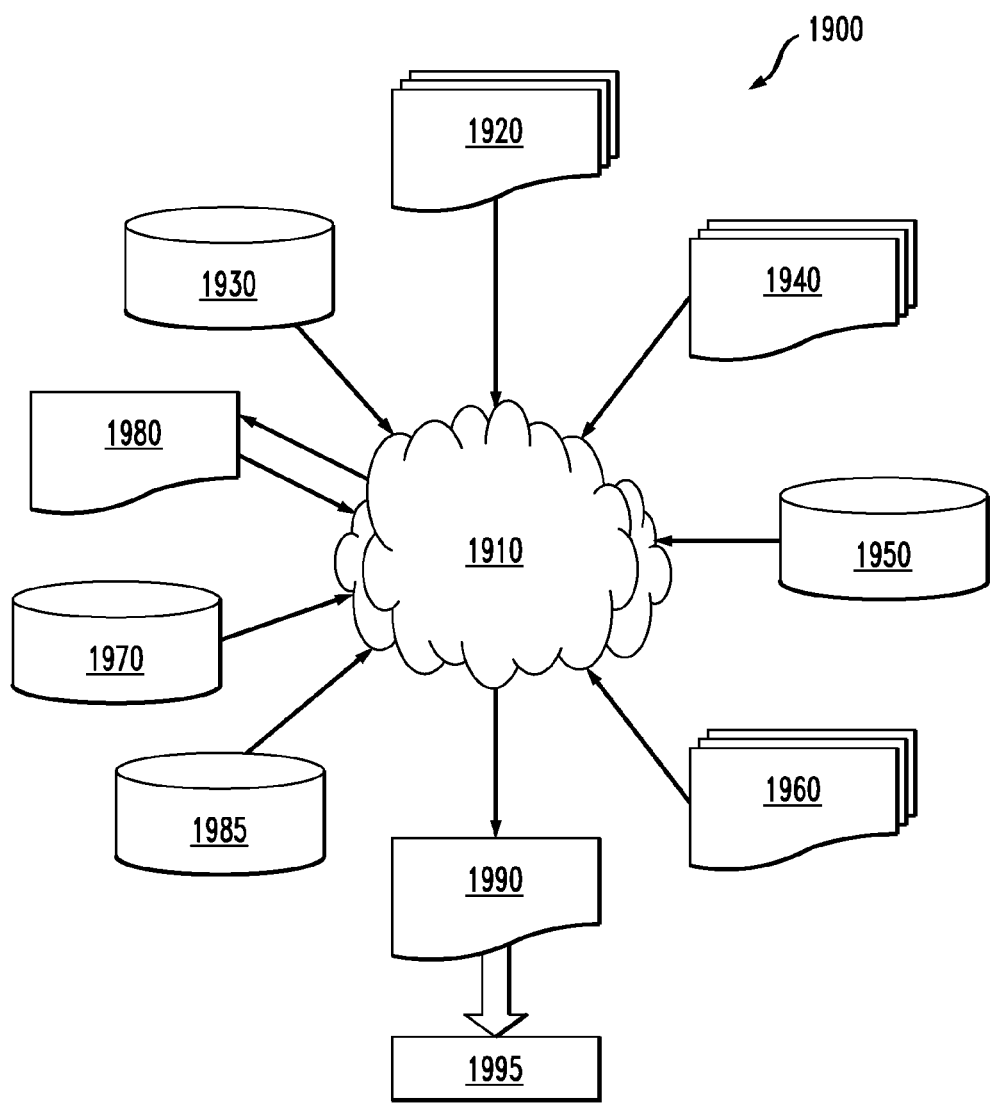
FIG. 10 is a flow diagram of a design process used in semiconductor design, manufacture, and/or test.

FIG. 10 shows a block diagram of an exemplary design flow 1900 used for example, in semiconductor IC logic design, simulation, test, layout, and manufacture. Design flow 1900 includes processes, machines and/or mechanisms for processing design structures or devices to generate logically or otherwise functionally equivalent representations of the design structures and/or devices described above and shown in FIGS. 2, 3, 4, 7 and 8. The design structures processed and/or generated by design flow 1900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1900 may vary depending on the type of representation being designed. For example, a design flow 1900 for building an application specific IC (ASIC) may differ from a design flow 1900 for designing a standard component or from a design flow 1900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1920 that is preferably processed by a design process 1910. Design structure 1920 may be a logical simulation design structure generated and processed by design process 1910 to produce a logically equivalent functional representation of a hardware device. Design structure 1920 may also or alternatively comprise data and/or program instructions that when processed by design process 1910, generate a functional representation of the physical structure of a hardware device. Whether representing functional and/or structural design features, design structure 1920 may be generated using electronic computer-aided design (ECAD) such as implemented by a core developer/designer. When encoded on a machine-readable data transmission, gate array, or storage medium, design structure 1920 may be accessed and processed by one or more hardware and/or software modules within design process 1910 to simulate or otherwise functionally represent an electronic component, circuit, electronic or logic module, apparatus, device, or system such as those shown in FIGS. 2, 3, 4, 7 and 8. As such, design structure 1920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1910 preferably employs and incorporates hardware and/or software modules for synthesizing, translating, or otherwise processing a design/simulation functional equivalent of the components, circuits, devices, or logic structures shown in FIGS. 2, 3, 4, 7 and 8 to generate a Netlist 1980 which may contain design structures such as design structure 1920. Netlist 1980 may comprise, for example, compiled or otherwise processed data structures representing a list of wires, discrete components, logic gates, control circuits, I/O devices, models, etc. that describes the connections to other elements and circuits in an integrated circuit design. Netlist 1980 may be synthesized using an iterative process in which netlist 1980 is resynthesized one or more times depending on design specifications and parameters for the device. As with other design structure types described herein, netlist 1980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1910 may include hardware and software modules for processing a variety of input data structure types including Netlist 1980. Such data structure types may reside, for example, within library elements 1930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1940, characterization data 1950, verification data 1960, design rules 1970, and test data files 1985 which may include input test patterns, output test results, and other testing information. Design process 1910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1910 without deviating from the scope and spirit of the invention. Design process 1910 may also include modules for performing standard circuit design processes such as timing analysis, verification, design rule checking, place and route operations, etc.

Design process 1910 employs and incorporates logic and physical design tools such as HDL compilers and simulation model build tools to process design structure 1920 together with some or all of the depicted supporting data structures along with any additional mechanical design or data (if applicable), to generate a second design structure 1990. Design structure 1990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1920, design structure 1990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2, 3, 4, 7 and 8. In one embodiment, design structure 1990 may comprise a compiled, executable HDL simulation model that functionally simulates the devices shown in FIGS. 2, 3, 4, 7 and 8.

Design structure 1990 may also employ a data format used for the exchange of layout data of integrated circuits and/or symbolic data format (e.g. information stored in a GDSII (GDS2), GL1, OASIS, map files, or any other suitable format for storing such design data structures). Design structure 1990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2, 3, 4, 7 and 8. Design structure 1990 may then proceed to a stage 1995 where, for example, design structure 1990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A parallel Huffman data decoder for decoding data encoded in accordance with a Huffman code, said parallel Huffman data decoder comprising:
   a holding register having a main portion holding a main data input, a lookahead portion holding a lookahead input, and a plurality of outputs;
   a plurality, M, of half-decoders, each having an input coupled to a corresponding one of said plurality of outputs of said holding register, and an output, said inputs each obtaining from said outputs of said holding register consecutive overlapping portions of data in said main portion and said lookahead portion of said holding register;
   a full decoder implemented in ternary content-addressable memory, said full decoder having an input selectively connectable to obtain a given one of said overlapping portions of data, and an output;
   a decoder selection and sequencing unit having a plurality of inputs coupled to said outputs of said half-decoders and said output of said full decoder, a selection output that controls said selective connection of said full decoder input, and a plurality of output lanes;
   wherein:
   said full decoder includes all code words of said Huffman code;
   said half-decoders includes a subset of frequently-occurring code words of said Huffman code;
   said half-decoders decode, in parallel, in a single clock cycle, when no code word not available in said half-decoders is encountered, M of said frequently-occurring code words; and
   when a code word not available in said half-decoders is encountered, said decoder selection and sequencing unit causes to be applied to said input of said full decoder, input intended for a corresponding one of said half-decoders, which input includes said code word not available in said corresponding one of said half-decoders.

2. The parallel Huffman data decoder of claim 1, wherein said half-decoders are implemented in a less expensive technology than said ternary content-addressable memory.

3. The parallel Huffman data decoder of claim 2, wherein said less expensive technology comprises static random access memory.

4. The parallel Huffman data decoder of claim 2, wherein said less expensive technology comprises dynamic random access memory.

5. The parallel Huffman data decoder of claim 1, further comprising a lookahead register having a data input to obtain a data stream, and having an output coupled to said main portion of said holding register, wherein said holding register obtains said lookahead input by tapping said data stream and bypassing said lookahead register.

6. The parallel Huffman data decoder of claim 1, further comprising a multiplexer having a first input coupled to said holding register, a selection input, and an output coupled to said input of said full decoder, wherein said decoder selection and sequencing unit causes to be applied to said input of said full decoder, said input intended for said corresponding one of said half-decoders, which input includes said code word not available in said corresponding one of said half-decoders, by sending a selection signal to said selection input.

7. The parallel Huffman data decoder of claim 1, wherein said overlapping portions of data overlap by one bit.

8. A design structure tangibly embodied in a non-transitory machine readable medium for designing, manufacturing, or testing an integrated circuit, the design structure comprising a parallel Huffman data decoder for decoding data encoded in accordance with a Huffman code, said parallel Huffman data decoder in turn comprising:

a holding register having a main portion holding a main data input, a lookahead portion holding a lookahead input, and a plurality of outputs;

a plurality, M, of half-decoders, each having an input coupled to a corresponding one of said plurality of outputs of said holding register, and an output, said inputs each obtaining from said outputs of said holding register consecutive overlapping portions of data in said main portion and said lookahead portion of said holding register;

a full decoder implemented in ternary content-addressable memory, said full decoder having an input selectively connectable to obtain a given one of said overlapping portions of data, and an output;

a decoder selection and sequencing unit having a plurality of inputs coupled to said outputs of said half-decoders and said output of said full decoder, a selection output that controls said selective connection of said full decoder input, and a plurality of output lanes;

wherein:

said full decoder includes all code words of said Huffman code;

said half-decoders includes a subset of frequently-occurring code words of said Huffman code;

said half-decoders decode, in parallel, in a single clock cycle, when no code word not available in said half-decoders is encountered, M of said frequently-occurring code words; and when a code word not available in said half-decoders is encountered, said decoder selection and sequencing unit causes to be applied to said input of said full decoder, input intended for a corresponding one of said half-decoders, which input includes said code word not available in said corresponding one of said half-decoders.

9. The design structure of claim 8, wherein, in said parallel Huffman data decoder, said half-decoders are implemented in a less expensive technology than said ternary content-addressable memory.

10. The design structure of claim 9, wherein, in said parallel Huffman data decoder, said less expensive technology comprises static random access memory.

11. The design structure of claim 9, wherein, in said parallel Huffman data decoder, said less expensive technology comprises dynamic random access memory.

12. The design structure of claim 8, wherein said parallel Huffman data decoder further comprises a lookahead register having a data input to obtain a data stream, and having an output coupled to said main portion of said holding register, wherein said holding register obtains said lookahead input by tapping said data stream and bypassing said lookahead register.

13. The design structure of claim 8, wherein said parallel Huffman data decoder further comprises a multiplexer having a first input coupled to said holding register, a selection input, and an output coupled to said input of said full decoder, wherein said decoder selection and sequencing unit causes to be applied to said input of said full decoder, said input intended for said corresponding one of said half-decoders, which input includes said code word not available in said corresponding one of said half-decoders, by sending a selection signal to said selection input.

14. The design structure of claim 8, wherein, in said parallel Huffman data decoder, said overlapping portions of data overlap by one bit.

15. A method for decoding, in parallel, data encoded in accordance with a Huffman code, said method comprising:

holding in a holding register a main data input and a lookahead input;

providing to a plurality, M, of half-decoders, consecutive overlapping portions of said main data input and said lookahead input, said half-decoders including a subset of frequently-occurring code words of said Huffman code;

when no code word not available in said half-decoders is encountered, decoding, in parallel, in a single clock cycle, M of said frequently-occurring code words;

when a code word not available in said half-decoders is encountered, applying to an input of a full decoder implemented in ternary content-addressable memory, input intended for a corresponding one of said half-decoders, which input includes said code word not available in said corresponding one of said half-decoders, said full decoder including all code words of said Huffman code.

16. The method of claim 15, further comprising implementing said half-decoders in a less expensive technology than said ternary content-addressable memory.

17. The method of claim 15, further comprising implementing said half-decoders in static random access memory.

18. The method of claim 15, further comprising implementing said half-decoders in dynamic random access memory.

19. The method of claim 15, further comprising holding said main data input in a lookahead register while said lookahead input bypasses said lookahead register.

20. The method of claim 15, wherein said applying to said input of said full decoder said input intended for said corresponding one of said half-decoders is implemented with a multiplexer.

* * * * *